US008129745B2

(12) United States Patent
Moon et al.

(10) Patent No.: US 8,129,745 B2
(45) Date of Patent: Mar. 6, 2012

(54) METHOD OF MANUFACTURING AN INSTANT PULSE FILTER USING ANODIC OXIDATION AND INSTANT PULSE FILTER MANUFACTURED BY SAID METHOD

(75) Inventors: Hak Beom Moon, Yangsan-si (KR); Jin Hyung Cho, Busan (KR); Suc Hyun Bang, Busan (KR); Cheol Hwan Kim, Busan (KR); Yoon Hyung Jang, Masan-si (KR)

(73) Assignee: Nextron Corporation, Busan (KR)

( * ) Notice: Subject to any disclaimer, the term of this patent is extended or adjusted under 35 U.S.C. 154(b) by 0 days.

(21) Appl. No.: 13/057,493

(22) PCT Filed: Apr. 3, 2009

(86) PCT No.: PCT/KR2009/001725
§ 371 (c)(1), (2), (4) Date: Feb. 4, 2011

(87) PCT Pub. No.: WO2010/016648
PCT Pub. Date: Feb. 11, 2010

(65) Prior Publication Data
US 2011/0133854 A1 Jun. 9, 2011

(30) Foreign Application Priority Data
Aug. 6, 2008 (KR) ........................ 10-2008-0076812

(51) Int. Cl.
*H01L 21/00* (2006.01)

(52) U.S. Cl. ................ 257/173; 257/355; 257/E23.141; 257/E21.175; 438/10; 361/56; 977/932; 29/25.01

(58) Field of Classification Search .................. 257/173, 257/355; 438/10; 361/56; 977/932; 29/25.01
See application file for complete search history.

(56) References Cited

U.S. PATENT DOCUMENTS

2004/0160300 A1* 8/2004 Shrier ............................ 337/16
(Continued)

FOREIGN PATENT DOCUMENTS

| | | | |
|---|---|---|---|
| JP | 2002-329872 | A | 11/2002 |
| JP | 2008-147271 | A | 6/2008 |
| KR | 10-0781487 | B | 11/2007 |
| WO | WO 2008-053717 | A1 | 5/2008 |

OTHER PUBLICATIONS

International Search Report in International Application No. PCT/KR2009/001725.

*Primary Examiner* — Alexander Ghyka
(74) *Attorney, Agent, or Firm* — Finnegan, Henderson, Farabow, Garrett and Dunner, LLP

(57) ABSTRACT

The instant pulse filter according to the present invention, which may cause a malfunction or a short life span of a semiconductor device, is made using an aluminum anodic oxidation, comprising—a first step for forming an aluminum thin film layer on an upper side of an insulator substrate; a second step for forming an aluminum oxide thin film layer having a pore by oxidizing the aluminum thin film layer by means of an anodic oxidation; a third step for depositing a metallic material on an upper side of the aluminum thin film layer for filling the pore; a fourth step for forming a nano rod in the interior of the aluminum oxide thin film layer by eliminating the metallic material deposited except in the pore; a fifth step for forming an internal electrode on an upper side of the aluminum oxide thin film layer having the nano rod; a sixth step for forming a protective film layer on an upper side of the same in order to protect the aluminum oxide thin film layer and the internal electrode from the external environment; and a seventh step for forming an external electrode on both sides of the substrate in which the protective film layer is formed.

14 Claims, 3 Drawing Sheets

U.S. PATENT DOCUMENTS

2005/0083163 A1* 4/2005 Shrier ............................. 337/16
2006/0234505 A1* 10/2006 Asano et al. .................. 438/688
2007/0146941 A1* 6/2007 Harris et al. .................... 361/18
2007/0151850 A1* 7/2007 Wang et al. ................... 204/424
2009/0310268 A1* 12/2009 Bertin et al. .................... 361/56
2009/0313819 A1* 12/2009 Shrier ............................. 29/846
2010/0147657 A1* 6/2010 Sen et al. ...................... 200/181
2010/0301299 A1* 12/2010 Suh et al. .......................... 257/1

* cited by examiner

METHOD OF MANUFACTURING AN INSTANT PULSE FILTER USING ANODIC OXIDATION AND INSTANT PULSE FILTER MANUFACTURED BY SAID METHOD

CROSS-REFERENCE TO RELATED APPLICATIONS

This application is a national phase application of International Application No. PCT/KR2009/001725, filed Apr. 3, 2009, and claims the priority of Korean Application No. 10-2008-0076812, filed Aug. 6, 2008, the contents of both of which are incorporated herein by reference.

TECHNICAL FIELD

The present invention relates to an instant pulse filter manufacturing method and an instant pulse filter manufacturing by the same in which an instant pulse filter is manufactured by an anodic aluminum oxide, with a view to preventing the conventional instant pulse filter being prone to malfunction in a semiconductor device resulting in a short product life, and in particular to a instant pulse filter manufacturing method using an anodic aluminum oxide and a instant pulse filter manufactured by the same which are characterized by an anodic oxide with a uniform energy barrier between conductors formed of regular nano rods with the aid of an anodic oxidation.

BACKGROUND ART

As portable devices or appliances become widely used, compactness and light weight of product become key issues along with a faster processing speed under current communication environments requiring faster transmissions of large capacity data. The use of low-voltage and low-power type semiconductors increases with the aid of highly integrated semiconductor, high speed switching devices for fast processing and portable devices and appliances.

Subsequently, such trend gives rise to developing and designing a circuit that is highly sensitive to an instant pulse and a transient voltage, with the result that downing of integrated circuits (IC) occur. It becomes necessary to use an instant pulse filter in preventing such IC downing.

The instant pulse filter is generally applied to a device requiring a high speed data transmission such as a cellular phone, a palmtop computer, a USB 2.0 controller, a HD TV, a set top box, antenna, RF circuits and etc. As high density data integration and high speed processing increasingly become a necessity, more attention is being paid to properly dealing with instant pulses.

As shown in FIG. 1, the instant pulses have been conventionally dealt with by using a polymer composite material prepared by mixing a conductive powder 40 to a polymer resin 30. An internal electrode 20 is formed in an epoxy substrate 10, and a polymer composite material is filled between the internal electrodes 20, and an external electrode 50 is formed on both sides of the same.

As shown therein, a polymer composite material is prepared so as to obtain a low discharge voltage on an upper side of the epoxy substrate 10. The polymer composite material can be applied as a discharge electrode in such a manner that a metallic conductive powder 40 is dispersed in a polymer resin 30, and an instant pulse path 60 is formed with the aid of the conductive powder 40. The polymer composite material is known to have many advantages—a low electrostatic capacity, a low leakage current and etc.

Another conventional art uses a ZnO laminated Varister in which ZnO is a voltage variable type resistant material.

The conventional instant pulse filter works like this: when polymer is used, it focuses on an electron tunneling by means of an electric field between neighboring conductive particles, and when laminated Varister is used, it is also based on electron tunneling by means of electric fields of short key barriers formed between ZnO grain and grain boundary.

The conventional technology using polymer does not properly work because a polymer resin with conductive metallic powder is weak to excessive instant pulse. Namely, as it becomes carbonized with resultant decrease of resistance, leakage occurs in grounding path with respect to a high speed digital signal, leading to a distortion and loss of data, with the result that digital signals are leaked to grounds instead of being normally transmitted, thus impeding the operation of the system.

When polymer is used, the thickness of energy barrier is not uniform due to a random distribution of conductive particles, so the nonlinearity of resistance with respect to the voltage of device is bad, and instant pulse energy capability is poor due to the characteristic that current tends to better flow toward a barrier having a lower energy when current flows via a voltage variable type resistance material (the entire portions of a voltage variable type resistance material between electrodes cannot be used as a current path). When a current path is formed on thin barriers, and a lot of current flow via the current path, thereby shortening the product life.

When laminated Varister is used, it has nonlinearity and high instant pulse absorption capacity, but a data distortion might occur due to a large electrostatic capacity when transmitting data at a high speed.

Neither polymer nor ZnO laminated Varister lend themselves to adjusting the dimensions of energy barriers of micro structures.

DISCLOSURE OF THE INVENTION

Accordingly, it is an objective of the present invention to provide an instant pulse filter manufacturing method using an anodic oxidation and an instant pulse filter manufactured by using the same.

A regular distribution of conductors and a uniformity of energy barrier are basic elements in an instant pulse filter. In order to obtain such characteristics, the present invention is directed to providing an instant pulse filter manufacturing method using an anodic oxide and an instant pulse filter manufactured by using the same in which conductors have regular distributions and uniform energy barriers between conductors in such a manner that a metallic material is deposited on an aluminum oxide thin film layer having pores formed by an anodic oxidation, and nano rods are formed in the pores.

It is another objective of the present invention to provide an instant pulse filter manufacturing method using an anodic oxide and an instant pulse filter manufactured by using the same in which an energy barrier thickness between conductors can be easily adjusted by further performing a widening and heat treatment process with respect to an aluminum oxide thin film.

To achieve the said objectives, an instant pulse filter manufacturing using an anodic oxidation is provided, comprising—a first step for forming an aluminum thin film layer 200 on an upper side of an insulator substrate 100; a second step for forming an aluminum oxide thin film layer 300 having a pore 310 by oxidizing the aluminum thin film layer 200 by means of an anodic oxidation; a third step for depositing a metallic material on an upper side of the aluminum thin film layer 300 for filling the pore 310; a fourth step for forming a nano rod 400 in the interior of the aluminum oxide thin film layer 300 by eliminating the metallic material deposited except in the pore 310; a fifth step for forming an internal electrode 500 on an upper side of the aluminum oxide thin film layer 300 having the nano rod 400; a sixth step for forming a protective film layer 600 on an upper side of the same in order to protect the aluminum oxide thin film layer 300 and the internal electrode 500 from the external environment; and a seventh step for forming an external electrode 700 on both sides of the substrate 100 in which the protective film layer 600 is formed.

The substrate 100 is made of one selected from among the group comprising alumina, silicon, glass and glassy resin.

The pore 310 of the second step is furthered by a widening process or a heat treatment process after an anodic oxide process. The pore 310 has a width of 100 nm to 10 μm. The height of said nano rod 400 is less than 10 μm.

The interval between said neighboring pores 310 is less than 100 nm.

The internal electrode 500 is a planar shape.

EFFECTS

In the present invention, a regular distribution and a uniformity of an energy barrier can be obtained in conductors formed of conductive nano rods, so it is possible to manufacture a chip type overvoltage protection part having a better nonlinear characteristic and a higher instant pulse capacity compared to a conventional art.

It is possible to easily adjust an energy barrier thickness between conductors by further performing a widening process or a heat treatment process after anodic oxide process is performed, so a trigger voltage, a clamp voltage, a leak current or the like can easily be adjusted without causing any change in the distance of electrodes.

BRIEF DESCRIPTION OF THE DRAWINGS

The present invention will become better understood with reference to the accompanying drawings which are given only by way of illustration and thus are not limitative of the present invention, wherein.

EXPLANATION OF REFERENCES IN THE DRAWINGS

Figure 1:
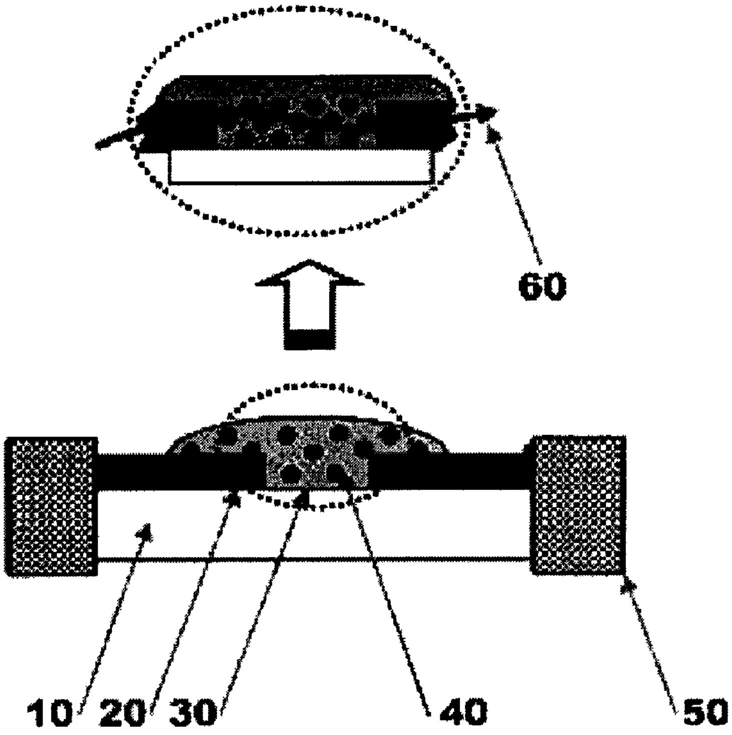
FIG. 1 is a schematic cross sectional view illustrating a conventional instant pulse filter.

10: epoxy substrate 20: internal electrode
30: polymer resin 40: conductive powder
50: external electrode 60: instant pulse path
100: substrate 200: aluminum oxide thin film layer
300: aluminum oxide thin film layer 310: pore
400: nano rod 500: internal electrode
600: protective layer 700: external electrode
S: instant pulse path

MODES FOR CARRYING OUT THE INVENTION

Figure 2:
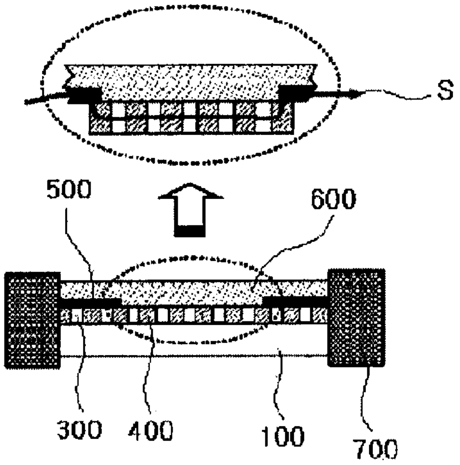
FIG. 2 is a cross sectional view illustrating an instant pulse filter according to the present invention.
Figure 3:
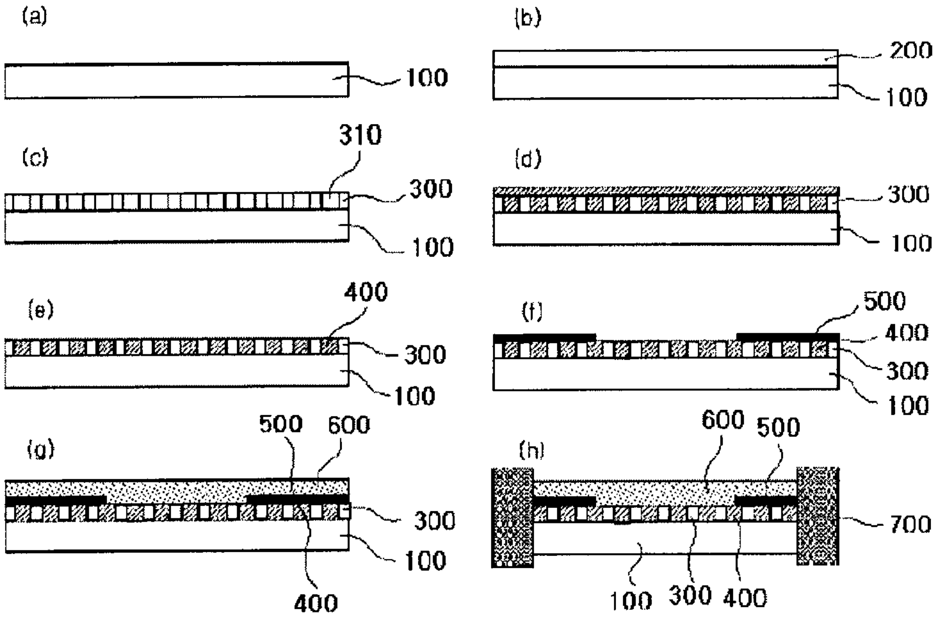
FIG. 3 is a schematic view illustrating a schematic process of an instant pulse filter according to the present invention.
Figure 4:
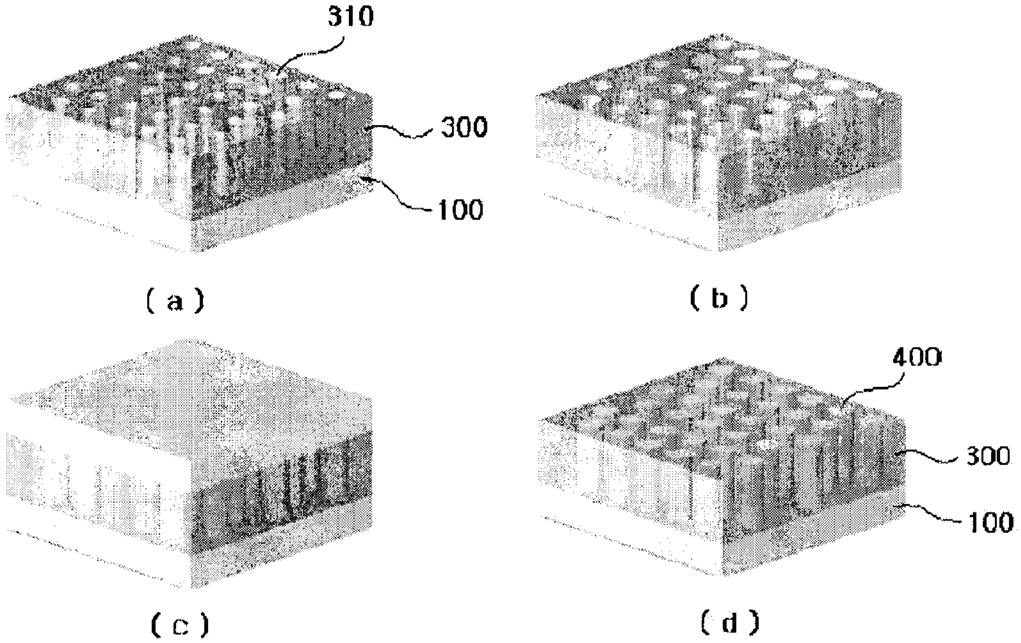
FIG. 4 is a perspective view for describing a widening process and a nano rod formation process in an instant pulse filter according to the present invention.

FIG. 2 is a cross sectional view illustrating an instant pulse filter according to the present invention, FIG. 3 is a schematic view illustrating a schematic process of an instant pulse filter according to the present invention, and FIG. 4 is a perspective view for describing a widening process and a nano rod formation process in an instant pulse filter according to the present invention.

As shown in FIG. 3, the instant pulse filter manufacturing method using an anodic oxidation comprises a first step for forming an aluminum thin film layer 200 on an upper side of an insulator substrate 100; a second step for forming an aluminum oxide thin film layer 300 having a pore 310 by oxidizing the aluminum thin film layer 200 by means of an anodic oxidation; a third step for depositing a metallic material on an upper side of the aluminum thin film layer 300 for filling the pore 310; a fourth step for forming a nano rod 400 in the interior of the aluminum oxide thin film layer 300 by eliminating the metallic material deposited except in the pore 310; a fifth step for forming an internal electrode 500 on an upper side of the aluminum oxide thin film layer 300 having the nano rod 400; a sixth step for forming a protective film layer 600 on an upper side of the same in order to protect from the external environment the aluminum oxide thin film layer 300 and the internal electrode 500; and a seventh step for forming an external electrode 700 on both sides of the substrate 100 in which the protective film layer 600 is formed.

The aluminum thin film layer 200 is formed on an upper side of the insulator substrate 10, and the aluminum thin film layer 200 is oxidized by the anodic oxidation, thereby forming a pore 310 therein. A metallic material is filled in the pore 310, thereby forming a nano rod 400. Then the internal electrode 500, the protective film layer 600 and the external electrode 700 are formed. The nano rod 400 is formed by filling a metallic material into the pore 310 formed with a regular shape and a constant size with the aid of anodic oxidation, with the result that it is possible to overcome the problems of instant pulse filters formed of a conductive powder having a non-uniformity and non-uniformly dispersed in a conventional polymer resin. In the present invention, it is possible to manufacture a chip type over voltage protective part having a quick reaction characteristics with the aid of high instant pulse capacity and low electrostatic capacity designs.

The preferred embodiments of the present invention will be described with reference to the accompanying drawings.

In a first step, an aluminum thin film layer 200 is formed on an upper side of an insulator substrate 100.

The material of the insulator substrate 100 is one selected from among alumina, silicon, glass and glassy epoxy. One with a chip type groove or without groove may be used.

The deposition method of the aluminum thin film layer 200 may be one selected from among sputtering, evaporation, PLD (pulsed laser deposition) and CVD (chemical vapor deposition).

In a second step, an aluminum oxide thin film layer 300 with a pore 310 is formed by oxidizing the aluminum thin film layer 200 by means of the anodic oxidation. Electrolyte is selected from among chromic acid ($CrO_3$: 2.5.3%), sulfuric acid ($H_2SO_4$: 15.2%), oxalic acid ($C_2H_2O_4$: 5.10%), boric acid ($H_3BO_3$: 9.15%), phosphoric acid ($H_3PO_4$: 10%). The insulator substrate 100 with the aluminum thin film layer 200 is immersed into an oxidation treatment reaction tank containing the electrolyte.

After connecting the cathode, a platinum plate as a reference electrode is immersed in the electrolyte solution in the oxidation treatment reaction tank and the anode is then connected for the anode oxidation.

Here, the widening process or heat treatment process can be further performed after anodic oxide process for adjusting the dimension of the pore 310, adjusting the thickness of barriers between the neighboring pores 310 and enhancing regularity. In case of widening process, diluted $H_3PO_4$ may be used.

As shown in FIG. 4, an aluminum oxide thin film layer 300 with a pore 310 is formed on an upper side of the insulator substrate 100. The diameter of the pore 310 can be increased by performing the widening process. The nano rod 400 of which width and interval are adjusted can be formed by depositing a metallic material on the upper side of the same and eliminating it subsequently.

The thickness of the energy barriers can easily be adjusted by adjusting the dimension and interval of the pore 310 with the aid of the widening process or the heat treatment process. The trigger voltage, clamp voltage and leak current can be advantageously adjusted without causing any change in the distance of electrodes.

In a third step, a metallic material is deposited on an upper side of the aluminum oxide thin film layer 300 so as to fill the pore 310. A sol and gel coating process, an ALD (atomic layer deposition) process, an evaporation or electric plating method can be used. A pure metal or doped semiconductors can be used depending on a deposition method.

In a fourth step, a nano rod 400 is formed in the interior of the aluminum thin film layer 200 by eliminating the metallic material deposited except in the pore 310. A physical or chemical method may be used. When Ru is deposited, a plasma reactive ion etching can be used along with $Cl_2$ gas. When Cu is deposited, it is immersed in solution mixed with $Cl_2$, and ultraviolet ray is radiated.

An instant pulse path S is formed with the aid of electron tunneling via the nano rods 400. An energy barrier is formed when insulation is formed at an aluminum oxide portion between nano rods 400.

In a fifth step, a planar internal electrode 500 is formed on an upper side of an aluminum oxide thin film layer 300 in which the nano rods 400 are formed by a lithography process of a common semiconductor and a thin film deposition process of a metal. The material of the internal electrode 500 is selected from among Au, Pt, Sn, Cr, Al, Cu, Ag, Ni, Ti, Ta, etc. The formation method is selected from among a vacuum physical deposition method, a vacuum chemical deposition method, a plating method, a screen printing method or a combination of at least two methods.

In a sixth step, a protective film layer 600 is formed an upper side in order to protect from external environment the aluminum oxide thin film 300 and the internal electrode 500 on which the nano rod 400 is formed. The material of the protective film layer 600 is an inorganic silicon, glass or fluorine resin. The formation method may be a sputtering method, a sol-gel method or a screen printing method.

At least two internal electrodes 500 are formed on one side of the voltage variable resistance material, resulting in extreme lowering of the electrostatic capacity, thereby making it possible to manufacture an instant pulse filter for high speed communication.

In a seventh step, an external electrode 700 is formed on both sides of the substrate 100 having the protective film layer 600. This could be achieved by a screen printing method or a common external electrode formation method.

The aluminum thin film layer 200 is formed on an upper side of the insulator substrate 100 by the above fabrication method, and the aluminum thin film layer 200 is oxidized by an anodic oxidation, thereby forming an aluminum oxide thin film layer 300 having a pore 310. A metallic material is formed on an upper side of the same, and the metallic material except in the pore 310 is eliminated, thereby manufacturing an instant pulse filter which is formed of a nano rod 400 regularly formed in the interior of the aluminum oxide thin film layer 300, an internal electrode 500 and a protective film layer 600 formed on an upper side of the same, and an external electrode 700 formed on both sides of the same.

As described above, the instant pulse path S is formed via the nano rod even over instant pulse inputted by a process for depositing aluminum on the insulator substrate 100, a process for forming an aluminum oxide thin film layer 300 having a regular shape and a constant dimension with the aid of anodic oxidation, a process for depositing a metallic material so that a pore 310 is filled by an electric plating method, an ALD (atomic layer deposition) or an evaporation method, a process for forming a nano rod 400 by eliminating a metal except in the pore 310 by a chemical or physical method, a process for forming at least two internal electrodes 500 on one side of the aluminum oxide thin film layer 300 having a nano rod 400 and a process for forming the protective film layer 600 and the external electrode 700. With the above construction, it is possible to obtain a high reliability by preventing the carbonization that occurs in conventional polymer resin.

In the present invention, it is possible to easily adjust a discharge voltage by adjusting a gap of an electrode by adjusting one voltage variable resistance material thickness, which results in an easier standard change. So, an instant pulse filter for a high speed communication can easily be manufactured. The present invention can be applied to a method of manufacturing an instant pulse filter, which may cause a malfunction and a short life span of a semiconductor device, using anodic aluminum oxidation and an instant pulse filter manufacturing by said method. Specifically, the present application can be applied to a method of manufacturing an instant pulse filter using anodic aluminum oxidation by which homogeneous distribution of conductors consisting of conductive nano rods can be formed and thus uniformity of an energy barrier can be achieved, and an instant pulse filter manufacture by the method.

What is claimed is:

1. A method of manufacturing an instant pulse filter using anodic oxidation, comprising:

a first step for forming an aluminum thin film layer over an insulator substrate;

a second step for forming an aluminum oxide thin film layer having a pore by oxidizing the aluminum thin film layer by means of an anodic oxidation;

a third step for depositing a metallic material over the aluminum oxide thin film layer for filling the pore;

a fourth step for forming a nano rod in the interior of the aluminum oxide thin film layer by eliminating the deposited metallic material except the inside of the pore;

a fifth step for forming an internal electrode over the aluminum oxide thin film layer having the nano rod;

a sixth step for forming a protective film layer over the aluminum oxide thin film layer and the internal electrode from the external environment in order to protect the aluminum oxide thin film layer and the internal electrode from the external environment; and a seventh step for forming an external electrode on both sides of the substrate on which the protective film layer is formed.

2. The method of claim 1, wherein said substrate is composed of at least one selected from the group consisting of alumina, silicon, glass and glassy resin.

3. The method of claim 1, wherein said pore of the second step is further processed by a widening process or a heat treatment process after an anodic oxidation.

4. The method of claim 1, wherein said pore has a width of 100 nm to 10 μm.

5. The method of claim 1, wherein the height of said nano rod is less than 10 μm.

6. The method of claim 1, wherein the interval between said neighboring pores is less than 100 nm.

7. The method of claim 1, wherein said internal electrode has a planar shape.

8. An instant pulse filter manufactured by a method using an anodic oxidation, comprising:

an insulator substrate;

an aluminum oxide thin film layer formed over the insulator substrate and composed of an aluminum oxide having a pore therein by means of an anodic oxidation;

a nano rod formed in the interior of the aluminum oxide thin film layer by depositing a metallic material in the pore;

an internal electrode formed over the aluminum oxide thin film layer having the nano rod;

a protective film layer formed over the aluminum oxide thin film layer and the internal electrode in order to protect the aluminum oxide thin film layer and the internal electrode from the external environment; and an external electrode formed on both sides of the substrate on which the protective film layer is formed.

9. The filter of claim 8, wherein said substrate is composed of at least one selected from the group consisting of alumina, silicon, glass and glassy resin.

10. The filter of claim 8, wherein said pore is further processed by a widening process or a heat treatment process after an anodic oxidation.

11. The filter of claim 8, wherein said pore has a width of 100 nm to 10 μm.

12. The filter of claim 8, wherein the height of said nano rod is less than 10 μm.

13. The filter of claim 8, wherein the interval between said neighboring pores is less than 100 nm.

14. The filter of claim 8, wherein said internal electrode has a planar shape.

* * * * *